US012660581B2

(12) United States Patent
Yu et al.

(10) Patent No.: US 12,660,581 B2
(45) Date of Patent: Jun. 16, 2026

(54) DOPING BARRIER LAYER TO FACILITATE METAL FILL WITH LARGE GRAIN SIZE

(71) Applicant: Winbond Electronics Corp., Taichung City (TW)

(72) Inventors: Ping-Lung Yu, Hsinchu City (TW); Po-Chun Shao, Hsinchu City (TW); Chu-Chun Hsieh, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 595 days.

(21) Appl. No.: 18/089,773

(22) Filed: Dec. 28, 2022

(65) Prior Publication Data

US 2024/0222191 A1 Jul. 4, 2024

(51) Int. Cl.
*H10W 20/00* (2026.01)
*H10W 20/41* (2026.01)

(52) U.S. Cl.
CPC ....... *H10W 20/051* (2026.01); *H10W 20/056* (2026.01); *H10W 20/425* (2026.01)

(58) Field of Classification Search
CPC ........................ H01L 21/76859; H10W 20/051
See application file for complete search history.

(56) References Cited

U.S. PATENT DOCUMENTS

| | | | | |
|---|---|---|---|---|
| 4,990,997 A * | 2/1991 | Nishida | ............. | H01L 21/76859 |
| | | | | 257/E21.584 |
| 6,703,307 B2 * | 3/2004 | Lopatin | ............. | H01L 21/76867 |
| | | | | 438/653 |
| 6,727,177 B1 * | 4/2004 | Catabay | ............ | H01L 21/76874 |
| | | | | 438/643 |
| 7,271,092 B2 | 9/2007 | Agarwal et al. | | |
| 7,648,908 B2 * | 1/2010 | Aoi | .................... | H01L 21/76883 |
| | | | | 438/687 |
| 8,877,633 B2 * | 11/2014 | Zhang | ............... | H01L 23/53219 |
| | | | | 438/653 |
| 10,079,245 B2 | 9/2018 | Han et al. | | |
| 2014/0273436 A1 * | 9/2014 | Hintze | ............. | H01L 21/76856 |
| | | | | 438/653 |
| 2020/0119152 A1 | 4/2020 | Wang et al. | | |
| 2021/0249269 A1 | 8/2021 | Aktas et al. | | |
| 2021/0351072 A1 * | 11/2021 | Chen | ................. | H01L 21/76864 |

* cited by examiner

*Primary Examiner* — Daniel Luke
(74) *Attorney, Agent, or Firm* — MUNCY, GEISSLER, OLDS & LOWE, P.C.

(57) ABSTRACT
A method for forming a semiconductor structure includes providing a substrate with an opening in or on the substrate. The method further includes conformally forming a barrier layer in the opening and on the substrate and performing an implantation process to implant a dopant into the barrier layer. The method further includes conformally forming a capping layer on the barrier layer and performing an annealing process, such that the dopant diffuses into the grain boundary of the barrier layer. The method further includes removing the capping layer and filling the opening with a conductive material.

15 Claims, 9 Drawing Sheets

<u>30</u>

10

160
130
124
110
105
100

162

10

155

150
130
135
132
124

20

162

130  165
126

100

20

120

130
126

100

DOPING BARRIER LAYER TO FACILITATE METAL FILL WITH LARGE GRAIN SIZE

BACKGROUND OF THE INVENTION

Field of the Invention

The present disclosure relates to a semiconductor process technology, and in particular to a method of forming a conductive feature.

Description of the Related Art

The critical dimensions of semiconductor devices are gradually being scaled down as development of those semiconductor devices advances, and the resistance of conductive features, such as embedded word lines, contacts, or vias, is gradually increasing. The industry still needs to improve the resistance of related conductive features to achieve its goal of reducing critical dimensions while maintaining the high performance of semiconductor devices. Using existing technical methods, the resistance of related conductive features is reduced by decreasing the thickness of the barrier layer or by reducing the number of nucleation cycles of the conductive material. However, this may increase the risk of the barrier layer and conductive material peeling off, or of increasing the threshold voltage (Vth) of the device.

BRIEF SUMMARY OF THE INVENTION

An embodiment of the present disclosure provides a method of forming a semiconductor structure. The method includes providing a substrate with an opening in or on the substrate. The method further includes conformally forming a barrier layer in the opening and on the substrate. The method further includes performing an implantation process to implant a dopant into the barrier layer. The method further includes conformally forming a capping layer on the barrier layer. The method further includes performing an annealing process, such that the dopant diffuses into the grain boundary of the barrier layer. The method further includes removing the capping layer. The method further includes filling the opening with a conductive material.

Another embodiment of the present disclosure provides a method of forming a semiconductor structure. The method includes providing a substrate with an opening in or on the substrate. The method further includes conformally forming a barrier layer in the opening and on the substrate. The method further includes forming a capping layer on the barrier layer, wherein the thickness of the capping layer above the bottom surface of the opening is less than thickness of the capping layer above the top surface of the substrate. The method further includes performing an implantation process to implant a dopant through the capping layer and into the barrier layer. The method further includes performing an annealing process, such that the dopant diffuses into the grain boundary of the barrier layer. The method further includes removing the capping layer. The method further includes filling the opening with a conductive material.

Another embodiment of the present disclosure provides a semiconductor structure. The semiconductor structure includes a substrate with an opening in or on the substrate. The semiconductor structure further includes a barrier layer lined in the opening, wherein a dopant is trapped at the grain boundary of the barrier layer. The semiconductor structure further includes a conductive material filled into the opening.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figures 1, 2:
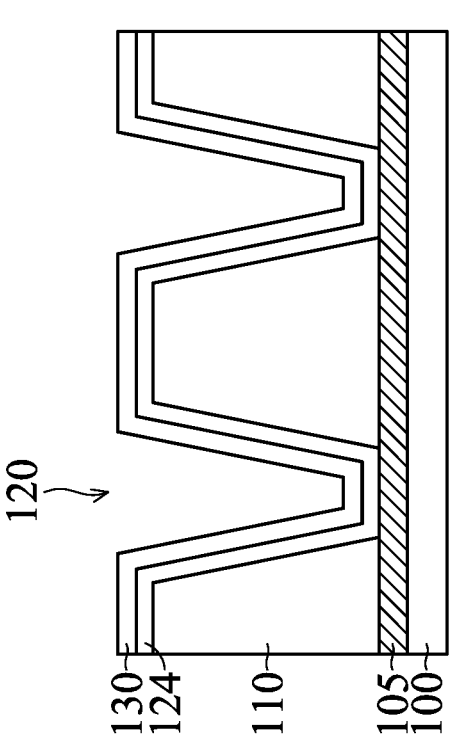
FIGS. 1, 2, 3, 4, 5, 6, 7, and 8 illustrate cross-sectional views at various stages of the semiconductor structure according to the first embodiment of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In existing semiconductor technology, tungsten (W) is usually used as the material for conductive features such as embedded word lines, contact plugs, and vias, and is usually formed by a deposition process with better filling capacity, such as a chemical vapor deposition (CVD) process. As the line width decreases, the related conductive features suffer from an increase in the resistance of the conductive material. The embodiments of the present disclosure provide a method for forming a conductive material with larger grain. The size of the grain affects the number of grain boundaries (i.e., the smaller the grain, the more grain boundaries, and the larger the grain, the less grain boundaries). The electrons pass through a conductive material with larger grains are obstructed by fewer grain boundaries, so that forming a conductive material with larger grains may reduce the resistance of the related features, and thus obtaining semiconductor structures with high electrical conductivity.

FIG. 1 illustrates a cross-sectional view of the semiconductor structure 10 according to a first embodiment of the present disclosure forming contact plugs or vias. According to the embodiment of the present disclosure, a substrate 100 is provided with an opening 120 on the substrate 100. A conductor layer 105 and a dielectric layer 110 are sequentially formed on the substrate 100, and the opening 120 is a contact opening disposed in the dielectric layer 110 and exposes a portion of the top surface of the conductor layer 105. In some embodiments, the substrate 100 may be an elemental semiconductor substrate, a compound semiconductor substrate, or an alloy semiconductor substrate. In other embodiments, substrate 100 may be a semiconductor on insulator (SOI) substrate.

Referring to FIG. 1, a barrier layer 130 is conformally formed in the opening 120 and on the substrate 100. The barrier layer 130 may ensure that the subsequently formed conductive material does not diffuse into the substrate 100 or the dielectric layer 110. Before forming the barrier layer 130, an adhesive layer 124 may be conformally formed in the opening 120 and on the substrate 100, and the barrier layer 130 may be conformally formed on the adhesive layer 124 to prevent the barrier layer 130 from peeling off from the substrate 100. In some embodiments, the barrier layer 130 includes a columnar crystal structure with columnar grain boundaries 132 (see FIG. 4 below). In some embodiments, the material of the barrier layer 130 may be TiN, TaN, WN, TaSiN, or TiSiN. In the first embodiment, the material of the adhesive layer 124 may be Ti or Ta.

FIG. 2 illustrates a cross-sectional view of the semiconductor structure 10 performing an implantation process 140 according to the first embodiment. According to the embodiment of the present disclosure, the implantation process 140 is performed to implant a dopant 135 into the barrier layer 130. In some embodiments, the implantation energy of the implantation process 140 is between 100 eV and 10 MeV, and the implantation dosage of the dopant 135 in the implantation process 140 is between E10 atoms/cm$^2$ and E18 atoms/cm$^2$. In some embodiments, the dopant 135 is boron (B).

Figure 3:
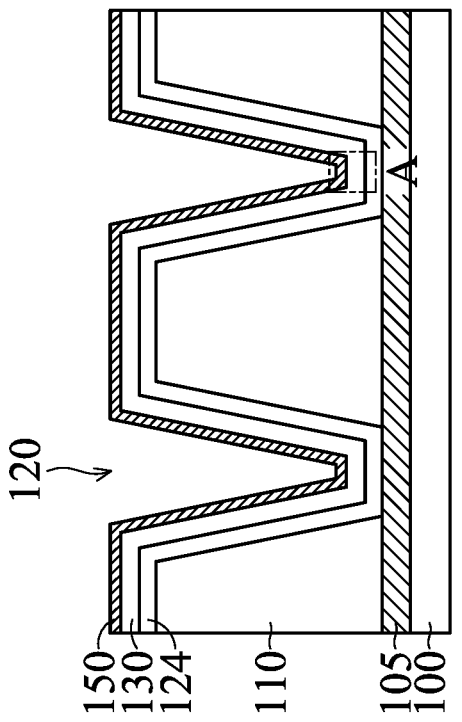

FIG. 3 illustrates a cross-sectional view of the semiconductor structure 10 after forming a capping layer 150 according to the first embodiment. After the implantation process 140 is performed, the capping layer 150 is conformally formed on the barrier layer 130. The capping layer 150 prevents the dopant 135 from escaping from the barrier layer 130 during the subsequent annealing process. In the first embodiment and the second embodiment, the capping layer 150 may have a uniform thickness. In some embodiments, the capping layer 150 of the first and second embodiments with uniform thickness may be formed by using atomic layer deposition (ALD) or other conformal CVD, including the deposition of the capping layer 150 with uniform thickness at a low deposition rate, low gas flow rate, long mean free path (MFP), low pressure, and low temperature conditions. In some embodiments, the material of the cap layer 150 may be SiN, SiO$_2$, SiCN, SiC, or SiON.

Figure 4:
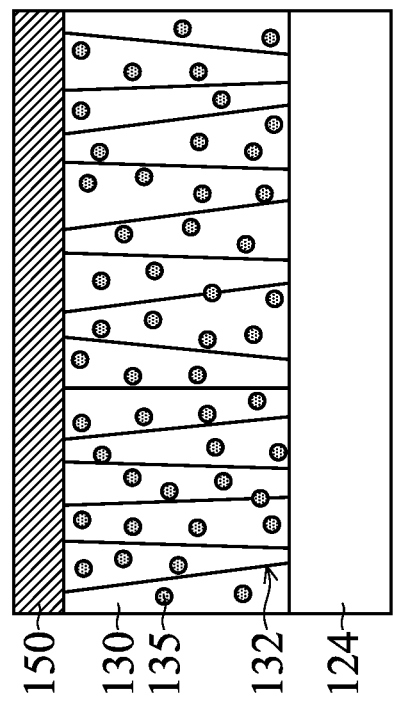
Figures 5, 6:
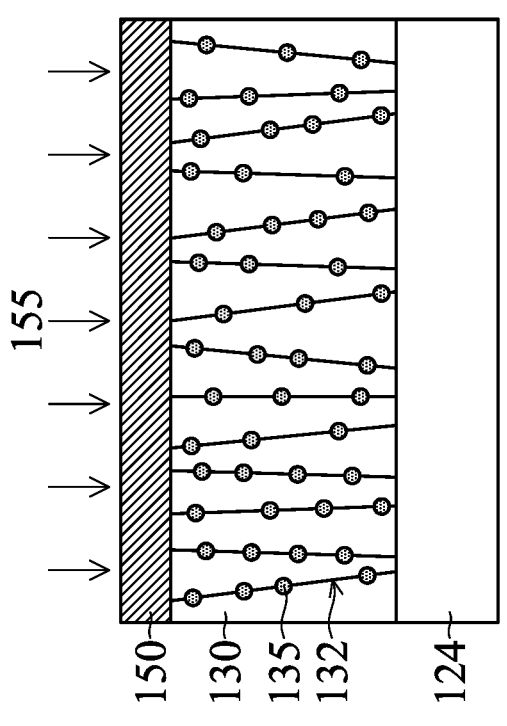

FIG. 4 illustrates a partial enlarged cross-sectional view of the semiconductor structure 10 of FIG. 3 at block A. After forming the capping layer 150, the dopant 135 remains randomly dispersed throughout the grains of the barrier layer 130. FIG. 5 illustrates a partial enlarged cross-sectional view of the semiconductor structure 10 of FIG. 3 at block A after performing an annealing process 155. After forming the capping layer 150, the annealing process 155 is performed such that the dopant 135 diffuses from the grains of the barrier layer 130 to the grain boundaries 132 of the barrier layer 130 due to the increase in temperature, and the capping layer 150 prevents the dopant 135 from escaping from the barrier layer 130. In some embodiments, the dopant 135 diffuses into the columnar grain boundaries 132 of the barrier layer 130. After performing the annealing process, the capping layer 150 may then be removed from the top surface of the barrier layer 130 by using an etching process such as a dry etching process or a wet etching process. In some embodiments, the temperature of the annealing process 155 is between 200° ° C. and 400° C., and the duration of the annealing process 155 is between 10 minutes and 360 minutes.

Figure 7:
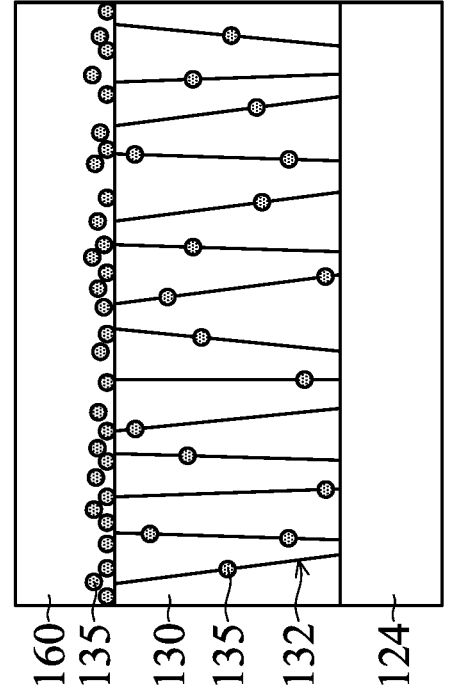

FIG. 6 illustrates a cross-sectional view of the semiconductor structure 10 after forming a conductive material layer 160 according to the first embodiment of the present disclosure. FIG. 7 illustrates a partial enlarged cross-sectional view of the semiconductor structure 10 of FIG. 6 at block A. After removal of the capping layer 150, the conductive material layer 160 is formed on the barrier layer 130. In some embodiments, because the conductive material layer 160 is formed at high temperature, at least a portion of the dopant 135 is diffused from the grain boundaries 132 of the barrier layer 130 to the surface of the barrier layer 130 in contact with the conductive material layer 160. In some embodiments, the temperature at which the conductive material layer 160 is formed is greater than or equal to the temperature of the annealing process 155. In some embodiments, the conductive material layer 160 is formed at a temperature of 300° C. to 400° C. In some embodiments, the conductive material layer 160 is tungsten (W).

Referring to FIG. 7, the forming of the conductive material layer 160 may include a nucleation step. During the formation of the conductive material layer 160, the dopant 135 diffusing from the grain boundaries 132 of the barrier layer 130 to the surface of the barrier layer 130 may allow the conductive material layer 160 to form a higher concentration of adsorbed atoms during the nucleation growth on the surface of the barrier layer 130, which may allow the conductive material layer 160 to form larger grains after the nucleation step and improve the resistance of the final formed semiconductor structure 10. It should be noted that after forming the conductive material layer 160, a portion of the dopant 135 remains trapped in the grain boundaries 132 of the barrier layer 130. Furthermore, since a portion of the dopant 135 remains trapped in the grain boundaries 132 of the barrier layer 130, it is possible for the semiconductor structure 10 to measure the content of the dopant 135 in the barrier layer 130 by elemental distribution analysis.

Figure 8:
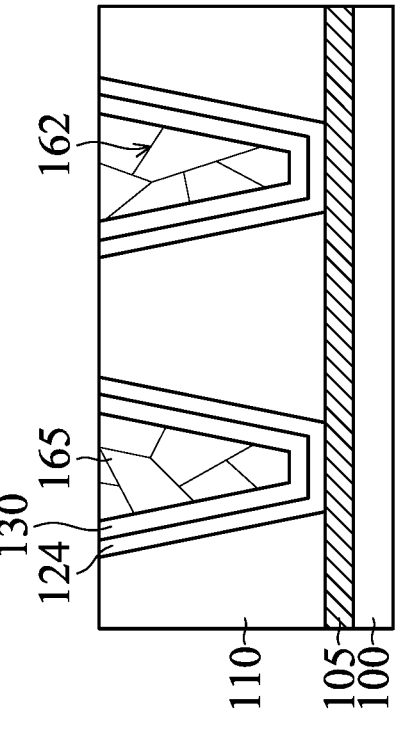

FIG. 8 illustrates a cross-sectional view of the semiconductor structure 10 after performing a planarization process according to the first embodiment of the present disclosure. After forming the conductive material layer 160, the planarization process is performed to expose the top surface of the dielectric layer 110, thereby forming the conductive material 165. The conductive material 165 has grain boundaries, which may be used to measure the size of the grains. In some embodiments, after forming the conductive material 165, the grain size of the conductive material 165 is between about 10 nm and about 300 nm.

The first embodiment provides a method of forming a conductive material 165 with larger grains by using dopant 135. After performing the planarization process, the semiconductor structure 10 may proceed to further processes, such as forming a metal interconnect structure to connect various features within the substrate 100, and the conductive material 165 may serve as contact plugs or vias for the semiconductor device, which will not be described herein.

Figures 9, 10:
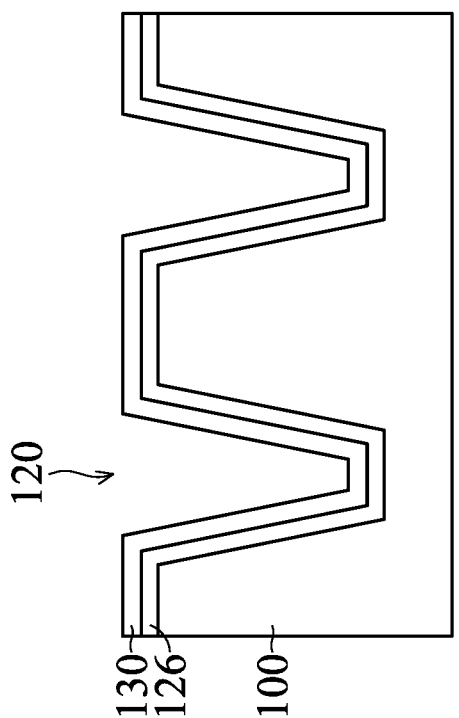
FIGS. 9 and 10 illustrate cross-sectional views at various stages of the semiconductor structure according to the second embodiment of the present disclosure.

The second embodiment of the present disclosure is illustrated below in conjunction with FIGS. 9-10. The second embodiment is similar to the first embodiment, except for the first embodiment is used to form contact plugs or vias in a back end of line (BEOL) process, while the second embodiment is used to form embedded word lines. FIG. 9 illustrates a cross-sectional view of the semiconductor structure 20 according to the second embodiment of the present disclosure forming embedded word lines. The opening 120 is a word line trench disposed in the substrate 100, and first an oxide layer 126 may be formed in the opening 120 and on the substrate 100 to avoid the subsequent formation of the barrier layer 130 from peeling off. In the second embodiment, the material of the oxide layer 126 may be SiO$_2$, SiN, or SiON. After forming the barrier layer 130, the second embodiment may continue with the processes as described in FIGS. 2-8 above, which will not be described herein. FIG. 10 illustrates a cross-sectional view of the semiconductor structure 20 after performing a planarization process according to the second embodiment of the present disclosure, thereby forming the conductive material 165.

As described above, the second embodiment provides a method of forming a conductive material 165 with larger grains by using dopant 135. In the second embodiment, after performing the planarization process, the semiconductor structure 20 may proceed to further processes, such as forming transistors and metal interconnect structures, and the conductive material 165 may be used as an embedded word line in the memory device, which will not be described herein.

Figure 11:
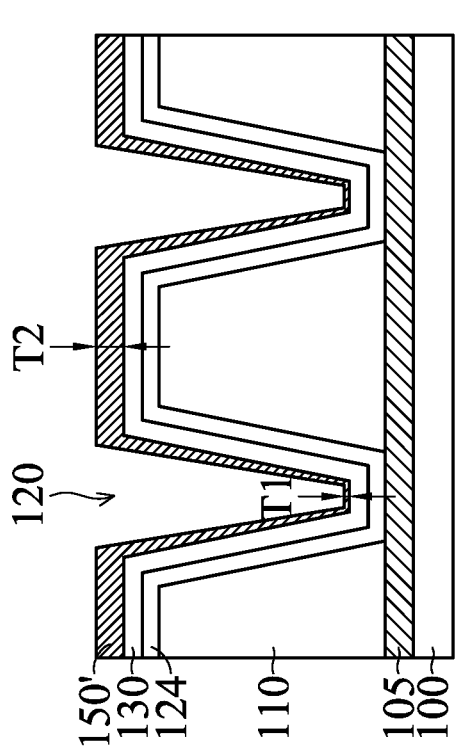

A third embodiment of the present disclosure is illustrated below in conjunction with FIGS. 11-14B. FIG. 11 illustrates a cross-sectional view of the semiconductor structure 30 according to the third embodiment of the present disclosure forming contact plugs or vias. The third embodiment is similar to the first embodiment, except for the capping layer 150 is formed after performing the implantation process 140 in the first embodiment, while the capping layer 150' with uneven thickness is formed before performing the implantation process 140 in the third embodiment. First, the conductor layer 105 and the dielectric layer 110 are sequentially formed on the substrate 100. Then, the adhesive layer 124 and the barrier layer 130 are conformally formed in the opening 120 and on the substrate 100, and the capping layer 150' with uneven thickness is formed on the barrier layer 130. The thickness T1 of the capping layer 150' above the bottom surface of the opening 120 is less than the thickness T2 of the capping layer 150' above the top surface of the dielectric layer 110. In some embodiments, the capping layer 150' of the third embodiment with uneven thickness may be formed by using physical vapor deposition (PVD), chemical vapor deposition (CVD), or other processes that form a film with low step coverage, including high deposition rate, high gas flow rate, short mean free path (MFP), high pressure, and high temperature conditions to form the capping layer 150' with uneven thickness. In some embodiments, the material of the capping layer 150' may be SiN, SiO$_2$, SiCN, SiC, or SiON.

Figure 12:
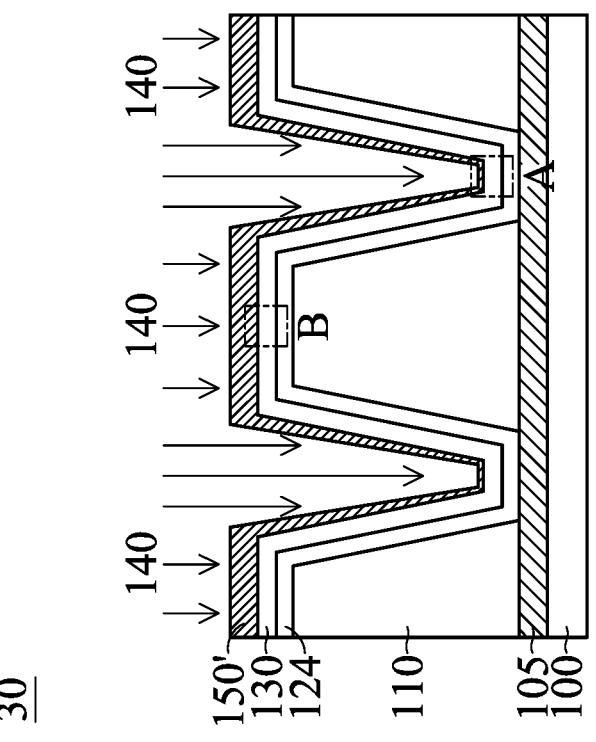
FIGS. 11, 12, 13A, 13B, 14A, and 14B illustrate cross-sectional views at various stages of the semiconductor structure according to the third embodiment of the present disclosure.

FIG. 12 illustrates a cross-sectional view of the semiconductor structure 30 performing the implantation process 140 according to the third embodiment of the present disclosure. After forming the capping layer 150', the implantation process 140 is performed to implant the dopant 135 through the capping layer 150' and into the barrier layer 130. Due to the difference in the thickness of the capping layer 150', the dopant 135 may pass through different thicknesses of the capping layer 150' before reaching the barrier layer 130 during the implantation process, so that the dopant 135 in the barrier layer 130 may have a different concentration. In other words, with the same implantation energy, if the dopant 135 only needs to pass through a smaller thickness (e.g., thickness T1 in FIG. 11) to reach the barrier layer 130 (i.e., low energy consumption), more of the dopant 135 may be implanted in this portion of the barrier layer 130, and if the dopant 135 needs to pass through a larger thickness (e.g., thickness T2 in FIG. 11) to reach the barrier layer 130 (i.e., high energy consumption), then less of the dopant 135 may be implanted in this portion of the barrier layer 130. In the third embodiment, the barrier layer 130 has a first concentration of dopant 135 at the bottom surface of the opening 120, the barrier layer 130 has a second concentration of dopant 135 at the top surface of the dielectric layer 110, and the first concentration is greater than the second concentration.

Figure 13B:
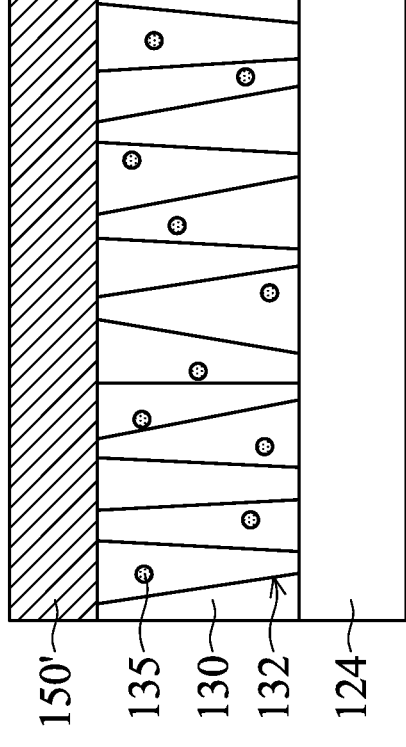
Figure 13A:
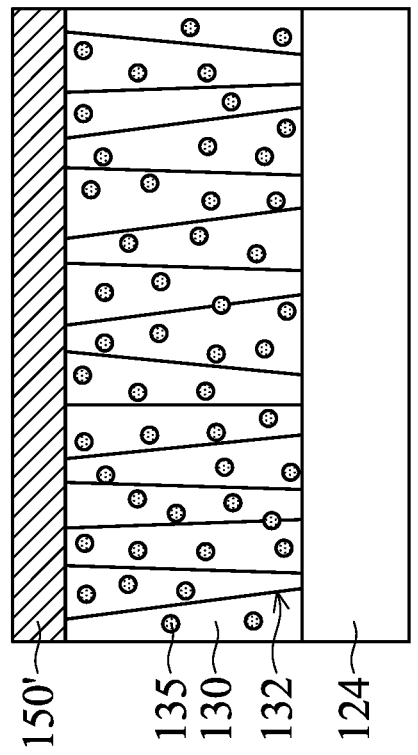

FIGS. 13A and 13B illustrate partial enlarged cross-sectional views of the semiconductor structure 30 of FIG. 12 after performing the implantation process 140 at block A and block B, respectively. In FIG. 13A, the dopant 135 only needs to pass through a thinner portion of the capping layer 150', so the barrier layer 130 below the thinner portion of the capping layer 150' has more of the dopant 135, while in FIG. 13B, the dopant 135 needs to pass through a thicker portion of the capping layer 150', so the barrier layer 130 below the thicker portion of the capping layer 150' has less of the dopant 135. After performing the implantation process 140, the implanted dopant 135 is randomly dispersed throughout the grains of the barrier layer 130.

Figure 14B:
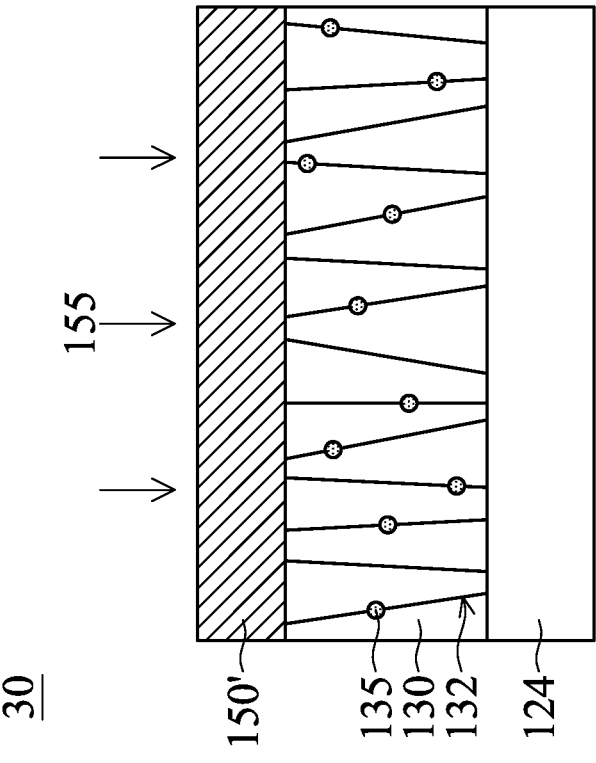
Figure 14A:
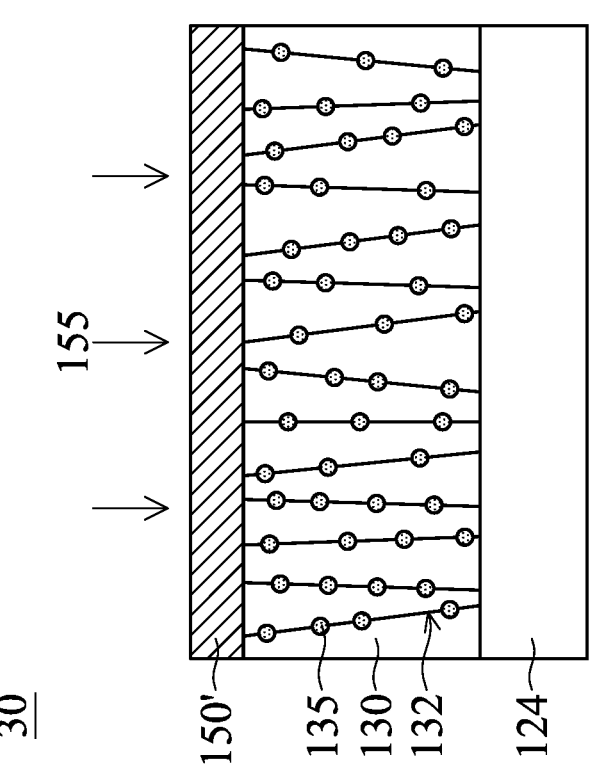

FIGS. 14A and 14B illustrate partial enlarged cross-sectional views of the semiconductor structure 30 of FIG. 12 after performing the annealing process 155 at block A and block B, respectively. After performing the implantation process 140, the annealing process 155 is performed so that the dopant 135 diffuses from the grains of the barrier layer 130 into the grain boundaries 132 of the barrier layer 130. The grain boundaries of the barrier layer 130 in FIG. 14A have more of the dopant 135, while the grain boundaries of the barrier layer 130 in FIG. 14B have less of the dopant 135. Therefore, the difference in the concentrations of the dopant 135 in the barrier layer 130 may result in the subsequent formation of the conductive material layer 160 with a larger formation rate for the portion with a higher dopant concentration and a smaller formation rate for the portion with a lower dopant concentration.

After performing the annealing process 155, the processes as described in FIGS. 6-8 above may be performed. According to the embodiment of the present disclosure, the capping layer 150' is then removed and a conductive material layer 160 is formed on the barrier layer 130 to fill the opening 120 with the conductive material 165. In the third embodiment, similar to the first embodiment, at least a portion of the dopant 135 may diffuse from the grain boundaries 132 of the barrier layer 130 to the surface of the barrier layer 130 in contact with the conductive material layer 160. However, in the third embodiment, since the barrier layer 130 has a difference in the concentrations of the dopant 135, this may cause a difference in the concentrations of the dopant on the surface of the barrier layer 130 as well, and further change the formation rate of the conductive material layer 160. Because the bottom surface of the opening 120 diffuses more of the dopant 135 compared to the sidewalls of the opening 120 and the top surface of the dielectric layer 110, allowing a higher concentration of adsorbed atoms to form on the bottom surface of the opening 120, so that the formation rate of the conductive material 165 on the bottom surface of the opening 120 may be greater than the formation rate of the conductive material 165 on the sidewalls of the opening 120 and on the top surface of the dielectric layer 110. In other words, the rate of filling of the bottom of the opening 120 by the conductive material 165 may be greater than the rate of sealing the top of the opening 120 by the conductive material 165, which effectively improves the filling efficiency of the conductive material 165 and avoids the formation of seams. The third embodiment provides a method of forming a conductive material with larger grains while avoiding the formation of seams in the opening 120.

Figure 15:
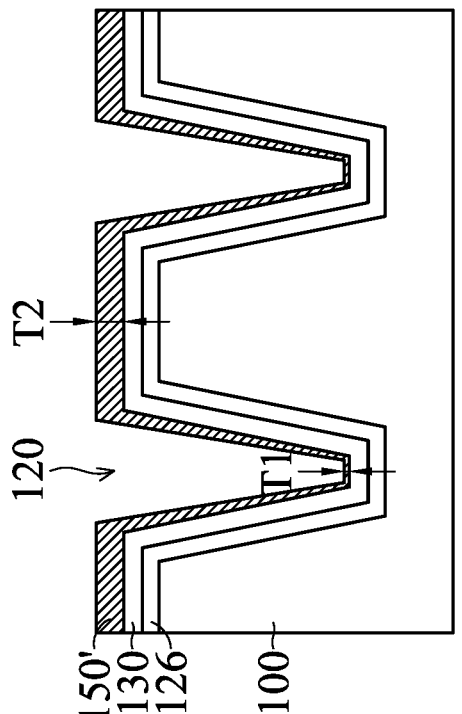

A fourth embodiment of the present disclosure is illustrated below in conjunction with FIGS. 15-16. The fourth embodiment is similar to the third embodiment, except for the third embodiment is used to form contact plugs or vias in the back end of line process, while the fourth embodiment is used to form embedded word lines. FIG. 15 illustrates a cross-sectional view of the semiconductor structure 40 according to the fourth embodiment of the present disclosure forming embedded word lines. The opening 120 is a word line trench disposed in the substrate 100. As described in FIG. 11 above, the capping layer 150' with uneven thickness is first formed, followed by performing the implantation process 140. The thickness T1 of the capping layer 150' above the bottom surface of the opening 120 is less than the thickness T2 of the capping layer 150' above the top surface of the dielectric layer 110.

Figure 16:
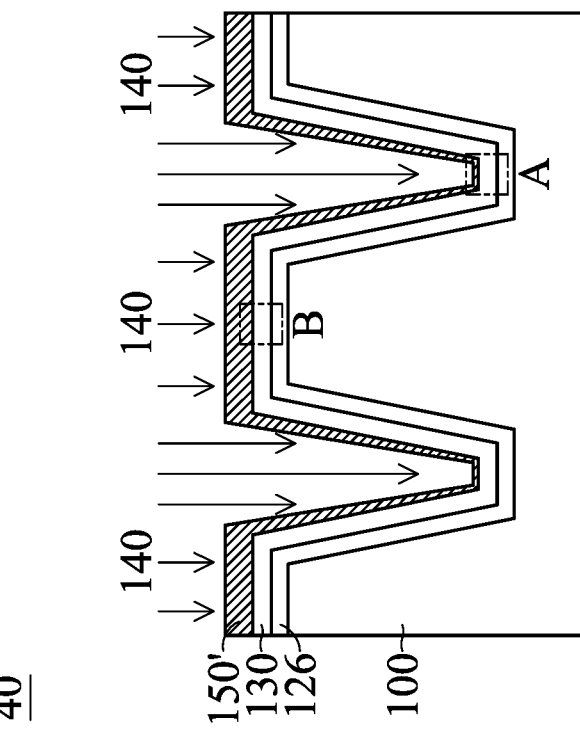
FIGS. 15 and 16 illustrate cross-sectional views at various stages of the semiconductor structure according to the fourth embodiment of the present disclosure.

FIG. 16 illustrate a cross-sectional view of the semiconductor structure 40 performing the implantation process 140 according to the fourth embodiment of the present disclosure. After forming the capping layer 150', the implantation process 140 is performed to implant the dopant 135 through the capping layer 150' and into the barrier layer 130. As described in FIG. 12 above, due to the difference in the thickness of the capping layer 150', the dopant 135 passes through different thicknesses of the capping layer 150' before reaching the barrier layer 130 during the implantation process, so that there may be a different concentration of dopant 135 in the barrier layer 130. After forming the capping layer 150', the processes as described in FIGS. 13A-14B, and in FIGS. 6-8 may proceed, and they will not be described again here.

In conclusion, the embodiments of the present disclosure provide methods for forming a conductive material with larger grains and controlling the formation rate of the conductive material on a barrier layer by an implantation process. Electrons passing through a conductive material with larger grains are obstructed by fewer grain boundaries, so that forming a conductive material with larger grains reduces the resistance of the related features, thereby obtaining a semiconductor structure with a high electrical conductivity. Controlling the formation rate of the conductive material on the barrier layer may effectively avoid the formation of seams in the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:
   providing a substrate with an opening in or on the substrate;
   conformally forming a barrier layer in the opening and on the substrate;
   performing an implantation process to implant a dopant into the barrier layer;
   conformally forming a capping layer on the barrier layer;
   performing an annealing process, such that the dopant diffuses into a grain boundary of the barrier layer, wherein the capping layer is present during the annealing process;
   entirely removing the capping layer; and
   then filling the opening with a conductive material.

2. The method as claimed in claim 1, wherein after filling the opening with the conductive material, a portion of the dopant remains trapped in the grain boundary of the barrier layer.

3. The method as claimed in claim 1, wherein a dielectric layer is disposed on the substrate, and the opening is a contact opening disposed in the dielectric layer.

4. The method as claimed in claim 1, wherein the opening is a word line trench disposed in the substrate.

5. The method as claimed in claim 1, wherein the dopant is boron, and the conductive material is tungsten.

6. The method as claimed in claim 1, wherein filling the opening with the conductive material comprises:
   forming a conductive material layer on the barrier layer; and
   performing a planarization process to expose a top surface of the substrate.

7. The method as claimed in claim 6, wherein the conductive material layer is formed at a temperature that is greater than or equal to a temperature of the annealing process.

8. The method as claimed in claim 7, wherein the temperature of the annealing process is between 200° C. and 400° C.

9. The method as claimed in claim 7, wherein the conductive material layer is formed at the temperature of 300° C. to 400° C.

10. The method as claimed in claim 1, wherein an implantation energy of the implantation process is between 100 eV and 10 MeV, and an implantation dosage of the dopant in the implantation process is between E10 atoms/cm$^2$ and E18 atoms/cm$^2$.

11. The method as claimed in claim 1, wherein while filling the opening with the conductive material, at least a portion of the dopant is diffused from the grain boundary of the barrier layer to a surface of the barrier layer in contact with the conductive material.

12. A method of forming a semiconductor structure, comprising:
   providing a substrate with an opening in or on the substrate;
   conformally forming a barrier layer in the opening and on the substrate;
   forming a capping layer on the barrier layer, wherein a thickness of the capping layer above a bottom surface of the opening is less than a thickness of the capping layer above a top surface of the substrate;
   performing an implantation process to implant a dopant through the capping layer and into the barrier layer;

performing an annealing process, such that the dopant diffuses into a grain boundary of the barrier layer, wherein the capping layer is present during the annealing process;

entirely removing the capping layer; and then filling the opening with a conductive material.

13. The method as claimed in claim 12, wherein the barrier layer comprises a first concentration of the dopant at the bottom surface of the opening, the barrier layer comprises a second concentration of the dopant at the top surface of the substrate, and the first concentration is greater than the second concentration.

14. The method as claimed in claim 12, wherein a formation rate of the conductive material at the bottom surface of the opening is greater than a formation rate of the conductive material at sidewalls of the opening.

15. The method as claimed in claim 12, wherein the dopant is boron, and the conductive material is tungsten.

\* \* \* \* \*